(12) United States Patent
Hayashi (10) Patent No.: US 8,455,915 B2
(45) Date of Patent: Jun. 4, 2013

(54) LIGHT EMITTING DEVICE

(75) Inventor: Masaki Hayashi, Anan (JP)

(73) Assignee: Nichia Corporation, Anan-Shi (JP)

(*) Notice: Subject to any disclaimer, the term of this patent is extended or adjusted under 35 U.S.C. 154(b) by 0 days.

(21) Appl. No.: 13/362,762

(22) Filed: Jan. 31, 2012

(65) Prior Publication Data

US 2012/0228662 A1   Sep. 13, 2012

(30) Foreign Application Priority Data

Feb. 2, 2011  (JP) .................................. 2011-020283

(51) Int. Cl.
*H01L 33/00* (2010.01)

(52) U.S. Cl.
USPC ............. 257/99; 257/100; 257/693; 257/694; 257/696; 257/698; 257/E33.058

(58) Field of Classification Search
USPC .................. 257/99, 100, 693, 694, 696, 698, 257/E33.058
See application file for complete search history.

(56) References Cited

FOREIGN PATENT DOCUMENTS

| JP | 2006-086408 | 3/2006 |
|---|---|---|
| JP | 2008-227485 | 9/2008 |

*Primary Examiner* — Tan N Tran
(74) *Attorney, Agent, or Firm* — Foley & Lardner LLP (57) ABSTRACT

The light emitting device according to the present invention includes a resin molded body having a recess, a first electrically conductive member and a second electrically conductive member each having terminal portions respectively exposed from a first outer side surface and second outer side surface which are opposite outer side surfaces among the outer side surfaces of the resin molded body, and a light emitting element mounted on the first electrically conductive member exposed at a bottom surface of the recess. The recess has a first bottom surface on which the light emitting element is mounted and a second bottom surface arranged at a higher position of the outer periphery of the first bottom surface.

17 Claims, 5 Drawing Sheets

LIGHT EMITTING DEVICE

BACKGROUND OF THE INVENTION

1. Field of the Invention

The present invention relates to a light emitting device applicable to purposes such as lighting apparatus, and more particularly to a light emitting device with excellent light extraction efficiency, and a method of manufacturing the light emitting device.

2. Discussion of the Background

As a light source of a lighting apparatus, a light emitting device employing a semiconductor light emitting element (LED: light emitting diode) has been in practical use. As compared with conventional light sources, the light emitting element has a longer life and is capable of emitting light in an energy-saving manner, and is attracting attention as the next generation light source for lighting applications.

In recent years, further higher levels of output power generation and further downsizing of devices have been in demand and package structures having a smaller size and being capable of efficiently extracting light from light emitting element have been studied. For example, there is known an LED device which has a housing which includes a first cavity and a second cavity which is arranged at a higher position than the first cavity, a step surface formed at a boundary surface between the first cavity and the second cavity, a lead frame exposed at the step surface, and a wire connected to the exposed lead frame (for example, in Patent Reference 1).

RELATED ART REFERENCES

Patent References
 Patent Reference 1: JP 2006-86408A
 Patent Reference 2: JP 2008-227485A

Problem to be Solved by the Invention

With a shape as in Patent Reference 2, the light extracting efficiency can be improved. However, in Patent Reference 2, in a top view, a lead frame is bent on the center line of the recess, so that the distance between the electrodes of the positive electrode side and the negative electrode side is inevitably increased according to the amount of the bending. Thus, in order to hold them together as a whole, a housing of a large size is needed. In addition, the lead frames are bent in the resin molded portion and then protruded outside, so that the size of the LED device increases corresponding to the amount of the bending of the lead frames. Meanwhile, with a shape such as in Patent Reference 1, downsizing of the device can be realized, but the lead frame having a light emitting element mounted thereon is suspended with respect to the bottom of the device, which decreases the heat dissipation to the mounting substrate, so that the electric current supply to the LED device must be small to avoid decrease in light extraction efficiency. For this reason, a small, high power output LED device cannot be made.

SUMMARY OF THE INVENTION

Means to Solve the Problem

In order to solve the problems described above, a light emitting device according to the present invention includes a resin molded body having a recess, a first electrically conductive member and a second electrically conductive member each having terminal portions respectively exposed from a first outer side surface and second outer side surface which are opposite outer side surfaces among the outer side surfaces of the resin molded body, and a light emitting element mounted on the first electrically conductive member exposed at a bottom surface of the recess. The recess has a first bottom surface on which the light emitting element is mounted and a second bottom surface arranged at a higher position of the outer periphery of the first bottom surface. The first electrically conductive member has a first bend portion which is at a position spaced apart from a center line connecting the center of the first outer side surface and the center of the second outer side surface and which extends upward away from the first bottom surface. The first electrically conductive member also has a first exposed portion which is continuous to the first bend portion and is exposed at the second bottom surface.

Effect of the Invention

With the construction according to the present invention, a light emitting device having excellent light extracting efficiency can be obtained.

BRIEF DESCRIPTION OF THE DRAWINGS

FIG. 1C(a) to FIG. 1C(c) are cross-sectional views of the light emitting device shown in FIG. 1A, in which FIG. 1C(a) is a cross-sectional view taken along line A-A, FIG. 1C(b) is a cross-sectional view taken along line B-B, and FIG. 1C(c) is a cross-sectional view taken along line C-C.

DETAILED DESCRIPTION OF PREFERRED EMBODIMENTS

Preferred embodiments of the present invention will be described below with reference to the accompanying drawings. The preferred embodiments are intended as illustrative of a light emitting device to give a concrete form to technical ideas of the present invention, and the scope of the invention is not limited to those described below. Particularly, the sizes, materials, shapes and the relative positions of the members described in examples are given as an example and not as a limitation to the scope of the invention unless specifically stated. The sizes and the arrangement relationships of the members in each of drawings are occasionally shown exaggerated for ease of explanation.

Figure 1A:
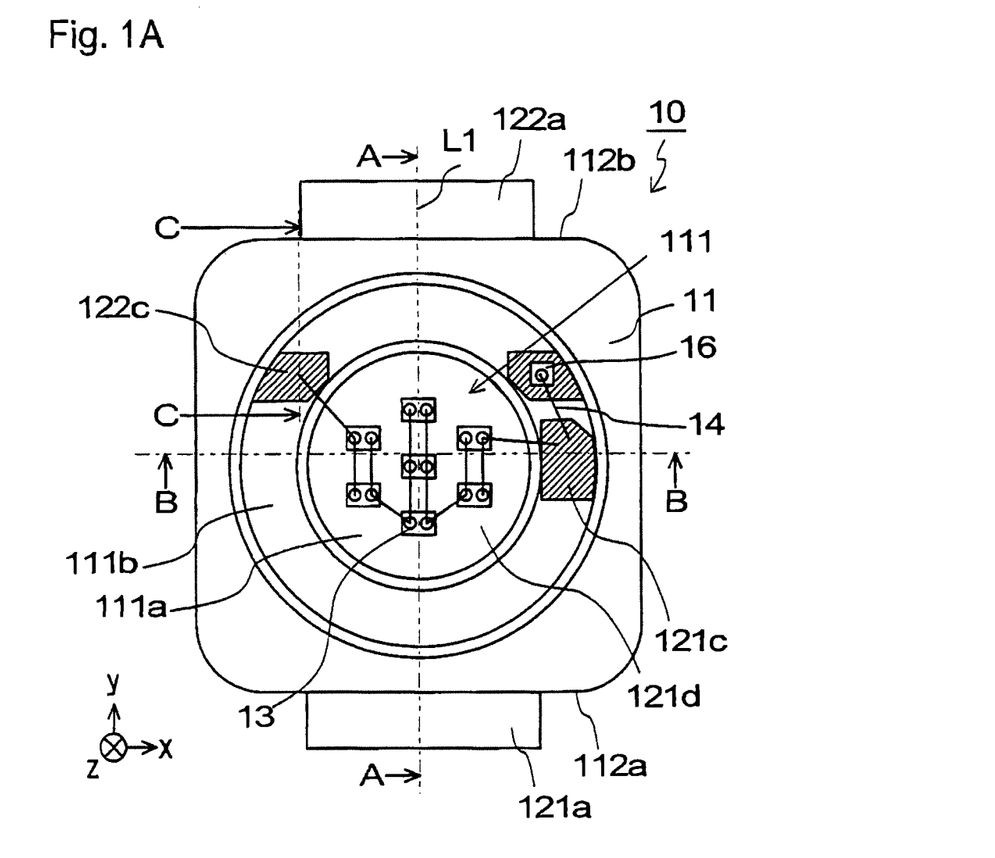
FIG. 1A is a top view showing a light emitting device according to an embodiment of the present invention.
Figure 1B:
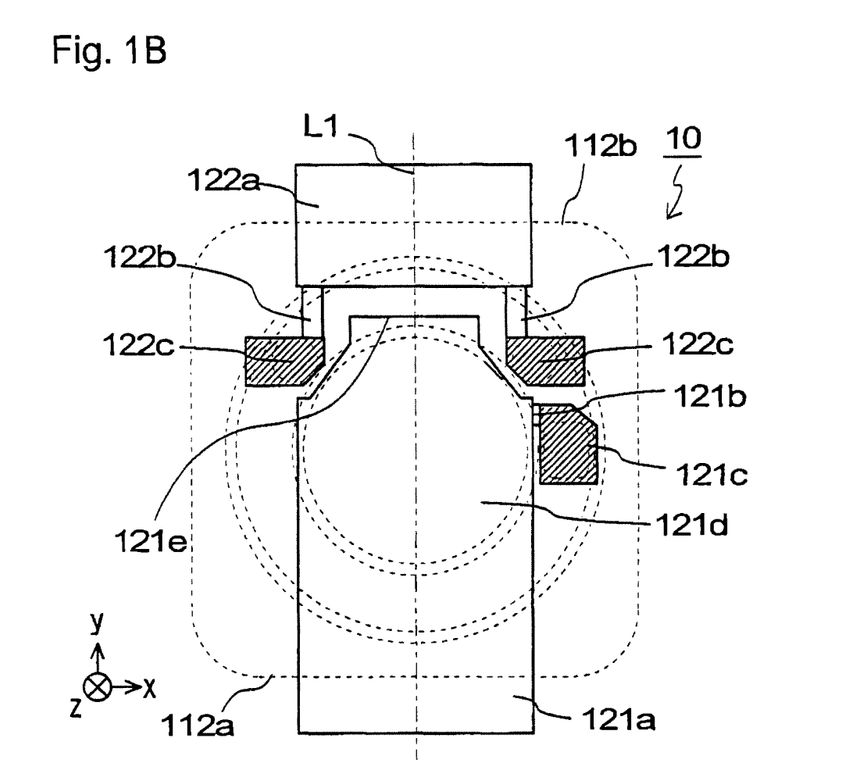
FIG. 1B is a top view showing an inner structure of the light emitting device shown in FIG. 1A.

FIG. 1A is a top view of a light emitting device 10 according to the present embodiment, FIG. 1B is a top view illustrating an inner structure through the resin molded body 11 shown in FIG. 1A, FIG. 3C(a) is a cross-sectional view taken along line A-A of FIG. 1A, FIG. 3C(b) is a cross-sectional view taken along line B-B of FIG. 1A, and FIG. 3C(c) is a cross-sectional view taken along line C-C of FIG. 1A.

As shown in FIG. 1A, in the light emitting device 10, a first electrically conductive member 121 and a second electrically conductive member 122 which are a pair of positive and negative electrodes are held together by the resin molded body 11 as a whole. The resin molded body 11 is arranged with a recess 111, and a plurality of light emitting elements 13 are mounted on the first electrically conductive member 121 which is exposed at the bottom surface in the recess 111. Outer surfaces of the resin molded body 11 includes a first outer side surface 112a and a second outer side surface 112b which are at the opposite sides. The first electrically conductive member 121 protrudes from the first outer side surface 112a and the second electrically conductive member 122 protrudes from the second outer side surface 112b.

The recess 111 has a first bottom surface 111a on which the light emitting elements 13 are mounted and a second bottom surface 111b which are arranged at a higher side of the outer periphery defining the first bottom surface 111a. With a straight line connecting the center of the first outer side surface 112a and the center of the second outer side surface 112b of the resin molded body 11 being indicated as the center line (L1), the first electrically conductive member 121 has a first bend portion 121b at a position spaced apart from the center line L1. The first bend portion 121b is bent upward from the bottom surface side of the recess and a part of the portion further continuous from the first bend portion 121b forms a first exposed portion 121c which is exposed at the second bottom surface 111b. In the present embodiment, arranging the first bend portion at such a position enables efficient extraction of light which is emitted from the light emitting elements, without a necessity of excessive increase in the size of the light emitting device (particularly the size of the light emitting device in the central axis L1 direction).

Hereinafter, each constructional member will be described in detail below. Herein, in the light emitting device, it may be indicated that the direction perpendicular to the bottom surface of the recess is z-axis direction and in a plane (in xy plane) perpendicular to the z-axis direction, the direction of the center line L1 is y-axis direction and a direction perpendicular to the y-axis direction is x-axis direction.

<Resin Molded Body>

The resin molded body arranged with a recess defined by a bottom surface and side surfaces is a member for protecting electronic components, such as a light emitting element and a wire, which are disposed in the recess. In the present embodiment, as shown in FIG. 1A, the resin molded body 11 has an outer shape approximately rectangular in top view and has a recess 111 at approximately the center thereof. Examples of the outer shape of the resin molded body 11 include a polygonal shape, a circular shape, an elliptical shape or a shape which is a combination of those, along with such a rectangular shape. Of the outer side surfaces of the resin molded body 11, an electrically conductive member is respectively exposed from a first outer side surface 112a and a second outer side surface 112b which are at the opposite sides. In the present specification, the term "opposite sides" refers to the surfaces at the opposite sides across the center point of the resin molded body 11 in top view, and include the cases in which, as in a quadrilateral, the first outer side surface and the second outer side surface are two surfaces which are distinguishable from each other with respect to a position, for example, of another interposing outer side surface, and the case in which, as in a circular outer shape, the first side surface and the second side surface are continuous curved surfaces and are indistinguishable as two individual surfaces.

In such a resin molded body 11, a recess having an upward opening is arranged. In FIG. 1A, a recess 111 having a circular opening is arranged. Further, the recess 111 has two bottom surfaces with different heights, a first bottom surface 111a and a second bottom surface 111b which is at a higher position than the first bottom surface 111a. The first bottom surface 111a is sufficient to have an area capable of having the light emitting elements 13 mounted thereon, and the second bottom surface 111b is sufficient to have an electrically conductive member exposed with an area capable of having electrically conductive wires connected thereto.

In the recess 111, in FIG. 1A, a single first bottom surface 111a is arranged in a single opening, but it is not limited thereto, two or more first bottom surfaces may be arranged in a single opening, or two or more recesses with different openings may be arranged. The shape of the opening in top view may be a circular shape or an elliptical shape, a polygonal shape, or further, a shape of a combination of those shapes. Also, the shape of the first bottom surface 111a may be a circular shape as shown in FIG. 1, or an elliptical shape, a polygonal shape, or a shape of a combination of those shapes, or a shape which is the same shape (the same shape with a different size) as the opening or a shape which is a different shape than the opening.

The second bottom surface is sufficiently arranged at a higher side and also at an outer periphery (outer side) of the first bottom surface, and in FIG. 1A, the second bottom surface is arranged at a whole periphery whose inner periphery is the top end of the inner side surface (first inner side surface) 111c of the first bottom surface 111a so as to be in a single plane in parallel to the first bottom surface 111a. The angle of the second bottom surface 111b may be different from that of the first bottom surface 111a, and further, a step or unevenness may be formed therein. Also, the second bottom surface 111b may be arranged not at the entire periphery of a higher position than the first inner surface 111c, but at a part thereof. In such a case, one or a plurality of two or more second bottom surfaces 111b may be arranged. As described above, in the case where the second bottom surface 111b is partially formed, the first exposed portion of electrically conductive member which to be described later is formed at a position spaced apart from the center line L1. Also, in the case where a plurality of the second bottom surfaces are arranged, each of the second bottom surfaces may have the same height, shape, and angle, or may have a height, shape, and angle, of which one of them is different, or all of them are different. Further, the second bottom surface 111b is, in FIG. 1A, formed with the resin molded body 11 and the exposed electrically conductive member (first exposed portion 121c), but it is not limited thereto; the second bottom surface 111b may be formed only with an electrically conductive member.

The inner side surface (first inner side surface 111c) of the first bottom surface 111a and the side surface (second inner side surface 111d) arranged at the periphery of the second bottom surface 111b may be formed with the same angle or with different angles, so that the light distribution characteristics of the light from the light emitting elements 13 can be further adjusted. Also, in the case where the second bottom surface 111b is partially formed, the first inner side surface 111c and the second inner side surface 111d may be formed as a surface with no boundary, or may be formed as a continuous surface (a continuous surface without interposing the second bottom surface) with different angles at the same height as the second bottom surface.

Figure 1C:
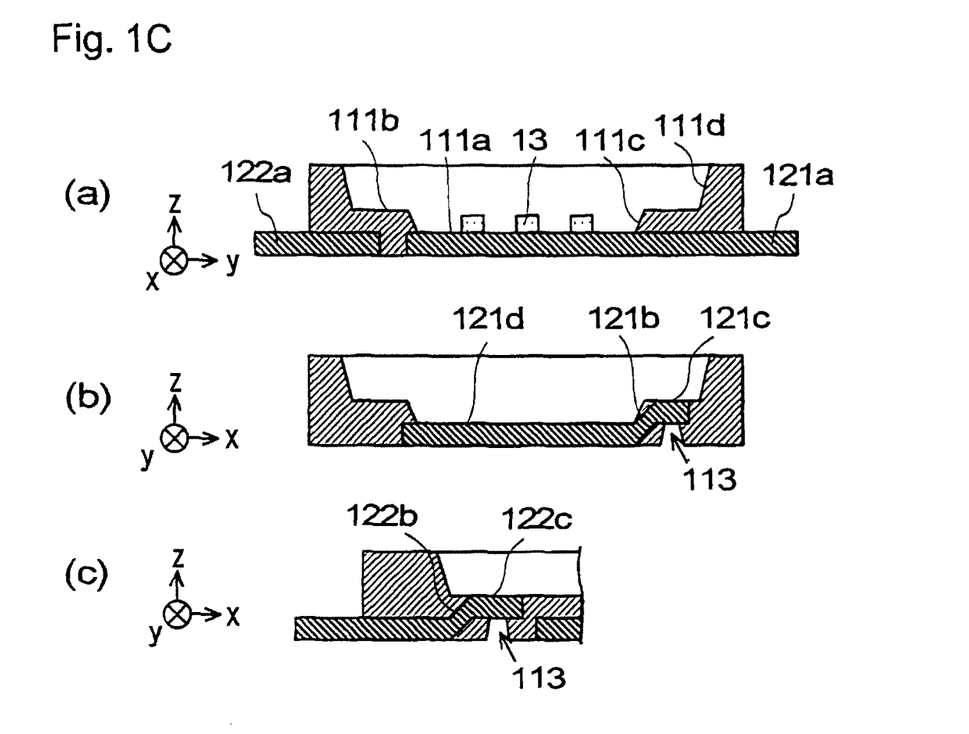
Figure 2:
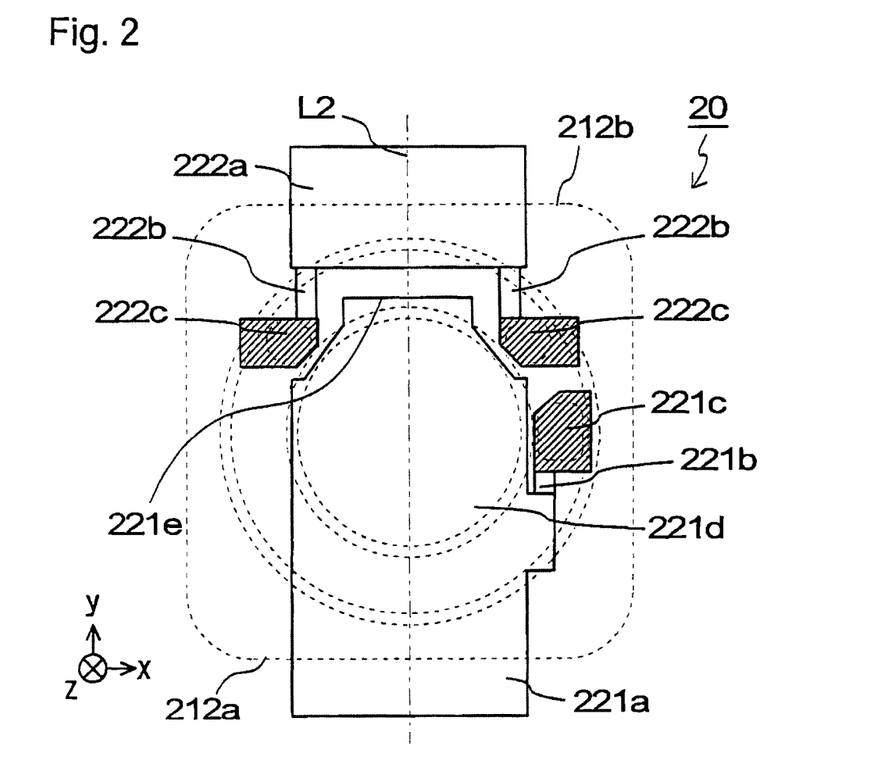
FIG. 2 is a top view showing a variant example of an inner structure of a light emitting device according to an embodiment of the present invention.
Figure 3:
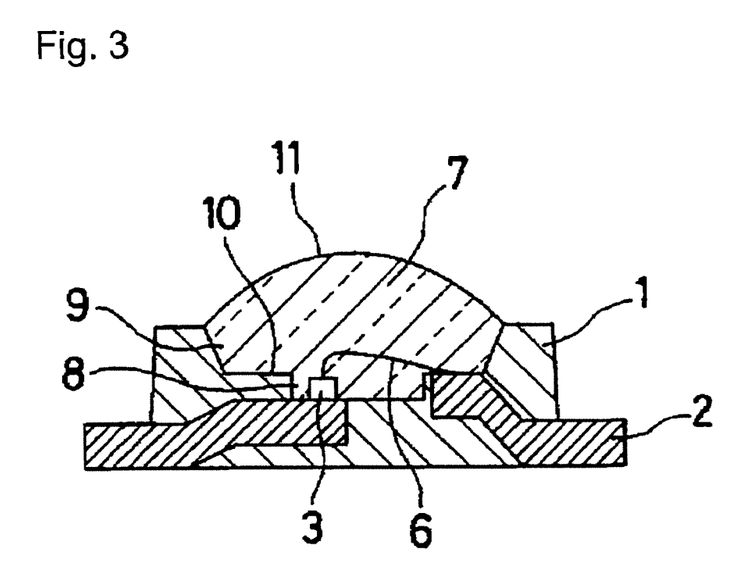
FIG. 3 is a cross-sectional view showing an example of conventional light emitting device.

Also, the height of the first inner side surface 111c and the height of the second inner side surface 111d are, in FIG. 1C, arranged so that the height of the first inner side surface 111c is smaller than the height of the second inner side surface 111d, that is, the second bottom surface 111b is closer to the lower side (first bottom surface 111a side) than to the upper side of the recess 111. This arrangement allows for a reduction in the length of the electrically conductive wire 14 from the light emitting elements 13, so that adverse effects due to breakage of a wire and such can be reduced. However, the invention is not limited to this embodiment; the first inner side surface 111c and the second inner side surface 111d may have the same height; that is, the second inner bottom surface 111b may be at a middle between the first bottom surface 111a and the opening (upper surface of the resin molded body), or may be at a position closer to the upper surface side of the recess.

Examples of such a resin molded body include thermoplastic resin such as aromatic polyamide such as PA6T and PA9T and aromatic polyester resin such as LCP, and thermosetting resin such as epoxy resin composition, silicone resin composition, modified epoxy resin composition such as silicone-modified epoxy resin, modified silicone resin composition such as epoxy-modified silicone resin, polyimide resin composition, and modified polyimide resin composition. It is preferable that such a material as described above is mixed with a filler such as fine particles of $TiO_2$, $SiO_2$, $Al_2O_3$, MgO, $MgCO_3$, $CaCO_3$, $Mg(OH)_2$, $Ca(OH)_2$ or the like, to adjust its reflectance of light in order to reflect about 60% or more, more preferably about 80% or more, of light from the light emitting elements.

<Electrically Conductive Member>

The electrically conductive member is employed to function as a pair of positive and negative electrodes for supplying electric power to a light emitting element, and is prepared by processing a plate-like metal into a desired size and shape and is held together as a whole by a resin molded body. In the present embodiment, the side where the light emitting elements are mounted is indicated as the first electrically conductive member and the side where no light emitting element is mounted is indicated as the second electrically conductive member. In addition to the first electrically conductive member and the second electrically conductive member, another electrically conductive member may further be arranged.

(First Electrically Conductive Member)

As shown in FIG. 1C, the first electrically conductive member 121 has a bottom surface portion 121d which is at the first bottom surface 111a of the recess 111 and has a light emitting elements 13 mounted thereon, a first bend portion 121b which is at the inner side of the resin molded body 11 which is a side wall defining the recess 111, and is extended in the x-axis direction from the bottom surface portion 121d and is bent upward (in the z-axis direction) of the recess 111, a first exposed portion 121c which is continuous to the first bend portion 121b and is exposed at the second bottom surface 111b of the recess 111 so that an electrically conductive wire 14 is connected thereto, and a first terminal portion 121a exposed at an outer side of the resin molded body 11 so as to serve as a current supply terminal for electrically connecting to an external current supply member. Among the edges which are at an opposite side of the first terminal portion 121a, an edge closest to the second outer side surface is indicated as the end portion 121e, and in the present embodiment, an edge locating on the center line L1 is indicated as the end portion 121e. In the present embodiment, at a position spaced apart from the center line which connects the center of the first outer side surface and the center of the second outer side surface, a first bend portion which extends upward away from the first bottom surface is arranged, and a first exposed portion is arranged continuous from the first bend portion and exposed at the second bottom surface.

The bottom surface portion 121d of the electrically conductive member which is exposed at the first bottom surface 111a of the recess 111 has an approximately flat surface with an area capable of having the light emitting elements 13 mounted thereon. The bottom surface portion 121d is not needed to be entirely one flat surface and may have a step difference (unevenness) and/or a cut-off portion at a position other than the mounting region for the light emitting elements 13. For the shape of the bottom surface portion 121d, other than a circular shape as shown in FIG. 1A, a polygonal shape, an elliptical shape, or a shape which is a combination of these shapes may be employed. In the present embodiment, as shown in FIG. 1A, the bottom surface portion 121d is arranged as approximately the entire surface of the first bottom surface 111a, the region being formed as a single flat surface. On the bottom surface portion 121d, the light emitting elements 13 are fixed through a bonding member (not shown), and an electrically conductive wire 14 for supplying the current is not connected to the bottom surface portion 121d. As described above, there is no need to reserve a connection region for the electrically conductive wire 14 on the bottom surface portion 121d, so that the light emitting elements 13 can be arranged in a balanced manner in the first bottom surface 111a so that the distribution characteristic of light emitted from the opening of the recess 111 can be easily adjusted to be approximately uniform.

The first bend portion 121b is for exposing the first electrically conductive member 121, which is a continuous piece, both at the first bottom surface 111a and the second bottom surface 111b which have different heights. In the present embodiment, as shown in FIG. 1 B, at a position spaced apart from the center line L1 within the resin molded body 11, the first bend portion 121b is arranged so that a part of the first electrically conductive member which is continuous from the bottom surface portion 121d extends upward away from the first bottom surface of the recess 111. The position where the first bend portion is extended out may be any position which is spaced apart from the center line L1 which connects the center of the first outer side surface and the center of the second outer side surface. In this arrangement, the first bend portion 121b is extended from a region, which is in the bottom surface 121d and which is spaced apart from the center line L1, toward a direction different from the direction of the center line L1, more specifically, toward a direction (x-axis direction) perpendicular to the center line L1. As described above, arranging the first bend portion 121b extending in a direction different from a direction of the center line L1 makes it possible to avoid a need of unnecessary length to the second electrically conductive member 122, in other words, makes it possible to avoid a need for an excessive size of the resin molded body 11 along the y-axis direction, when arranging a pair of positive and negative electrically conductive members.

The angle, the length, and the like of the bend of the first bend portion 121b can be adjusted according to the height of the second bottom surface. Also, the first bend portion 121b may be formed with a single slope, as shown in FIG. 1C, which does not include a step-like difference, or may be formed with a plurality of slopes each of which having different angles, or may be formed with a step difference. The width thereof may be such that, as shown in FIG. 1B, the first bend portion may have a same width from the bottom surface to the first exposed portion, or may have different widths, for example, the width from the bottom surface side toward the first exposed portion may be gradually decreased, or increased, or a step-like difference may be formed. Further, one or a plurality of first bend portions may be formed with respect to a single first exposed portion. Also, the first bend portion 121b may be arranged, as shown in FIG. 1B, in the vicinity of the bottom surface portion 221d, or may be arranged at a side close to the first terminal portion 121a. Also, a plurality of two or more first bend portions may be arranged. Further, the first bend portion 121b is preferably embedded in the resin molded body 11. In this case, only a part thereof may be embedded or the entire part thereof may be embedded. Embedding in the resin molded body allows an improvement in adhesion between the resin molded body and the electrically conductive member and at the same time enables formation of the first side surface around the light emitting elements only with the resin molded body, which facilitates an adjustment of the light distribution characteristics.

The first exposed portion 121c is exposed at the second bottom surface 111b and is a portion for connecting an electrically conductive wire thereto, so that it is arranged to expose a sufficient area for connecting the electrically conductive wire. In the case where a protective element is used, the protective element may be arranged at the first bottom surface 111a at which the light emitting elements have also be arranged, but the protective element is preferably mounted on the first exposed portion which is exposed at the second bottom surface 111b. In that case, depending on the nature of the protective element, as shown in FIG. 1A, the protective element may be arranged on the second exposed portion 122c of the second electrically conductive member, or may be arranged on the first exposed portion 121c of the first electrically conductive member. This arrangement allows reduction in the absorption of light from the light emitting elements 13 by the protective element.

In the present embodiment, as shown in FIG. 1A and FIG. 1B, one pentagonal first exposed portion 121c (shaded area) is arranged and a part thereof is embedded in the second inner side surface 111d. Embedding a part of the first exposed portion 121c makes it possible to prevent separation of the first exposed portion 121c from the resin molded body 11. The shape of the first exposed portion is not limited to a pentagonal shape; a polygonal shape, a circular shape, an elliptical shape, or a shape which is a combination of these shapes may be employed. The first exposed portion preferably has a flat or recessed shape. Forming a recessed shape enables to provide a resin coating to protect the plating and the wires. The size of the first exposed portion can also be selected according to the number of the electrically conductive wires and the like. But the first exposed portion is preferably exposed spaced apart from the first inner side surface 111c, so that bonding can be performed. The same can be applied to the second electrically conductive member.

The position of the first exposed portion 121c is preferably closer to the first outer side surface 112a than to the end portion 121e of the first electrically conductive member. This arrangement allows the second exposed portion 122c of the second electrically conductive portion to extend close to the light emitting elements, so that the length of the electrically conductive wires 14 can be reduced, which makes it possible to avoid occurrence of breakage of a wire and the like.

The resin molded body 11 under the first exposed portion 121c is arranged with a recess in lower surface 113 so as to expose a part of the lower surface of the first exposed portion 121c. This arrangement is for forming a protruded portion in a mold to press the electrically conductive member at the time of molding, and this arrangement, makes it possible to prevent formation of burrs caused by entering of molten resin at the upper side surface side of the first exposed portion 121c. Such a recess in the lower surface is also arranged under the first exposed portion of the second electrically conductive member.

The first terminal portion 121a is arranged exposed at the outer side surface of the resin molded body 11 and is electrically connected to an external circuit and the like through a solder and the like. In the present embodiment, as shown in FIG. 1A, a part of the first terminal portion 121a exposed at the first outer side surface 112a, which is one of the side surfaces of the approximately square resin molded body, is arranged protruding outward beyond the first outer side surface with its height being the same as the bottom surface portion arranged at the bottom surface portion of the recess; that is, the planar metal is extended as it is without being bent. The shape of the first terminal portion 121a in top view can be appropriately selected from a circular shape, an elliptic shape, a polygonal shape, or a shape which is a combination of these shapes, as well as an approximately quadrangular shape as shown in FIG. 1A, according to the aim and application. The first terminal portion 121a may be arranged not to be protruded from the first outer side surface, that is, it is exposed at the same plane as the first outer side surface.

(Second Electrically Conductive Member)

The second electrically conductive member, which is paired with the first electrically conductive member 121 to form a pair of positive and negative electrodes, is exposed from the second outer side surface 112b. As in the first electrically conductive member 121, the second electrically conductive member has a second bend portion 122b which extends upward away from the first bottom surface at a position spaced apart from the center line L1 which connects the center of the first outer side surface 112a and the center of the second outer side surface 112b, and a second exposed portion 122c which is continuous from the second bend portion 122b and is exposed at the second bottom surface 111b.

As in the first electrically conductive member, the second electrically conductive member has a second terminal portion 122a, a second bend portion 122b, and a second exposed portion 122c. Since it is not for mounting the light emitting elements, a bottom surface portion which is exposed at the bottom surface 111a of the recess 111 is not provided.

The second bend portion 122b is, in a region spaced apart from the center line L1, extended in a direction (y-axis direction) parallel to the center line L1, and in this embodiment, two second bend portions 122b are arranged so that the second exposed portion 122c is exposed at two positions interposing the recess 111. In this embodiment, the second bend portions 122b are arranged at positions symmetrical to the center line L1 with the same shape, angle, and size. The number thereof may be one or a plural number of three or more, and in the case of a plural number, different shapes, angles, and/or sizes may be employed. Also, as in the first electrically conductive member, the second bend portion 122b is preferably embedded in the resin molded member 11.

The second exposed portion 122c is a portion which is exposed at the second bottom surface 111b. In the present embodiment, as shown in FIG. 1B, the second exposed portions 122c are arranged at positions so as to be symmetrical to the center line L1, and the shapes thereof are pentagons mirror-symmetrical with each other. As the first exposed portion 121c of the first electrically conductive portion, a part of the second exposed portion 122c is embedded in the second inner side surface 111d. With this arrangement, the second exposed portion 122c can be prevented from separating from the resin molded body 11.

The position of the second exposed portion 122c is preferably closer to the first outer side surface 112a than to the end portion 121e of the first electrically conductive member. This arrangement allows the second exposed portion 122c of the second electrically conductive portion extends close to the light emitting elements, so that the length of the electrically conductive wires 14 can be reduced and which enables to avoid occurrence of disconnection. In the present embodiment, one protective element 16 is mounted, so that the first exposed portion 121c of the first electrically conductive member is arranged exposed at the second bottom surface 111b which is located in the vicinity of the protective element. As described above, arranging the first exposed portion 121c of the first electrically conductive member and the second exposed portion 122c of the second electrically conductive member at positions close to the protective element allows a reduction in the length of the electrically conductive wire 14 connected to the protective element 16.

Examples of the material for the first electrically conductive member and the second electrically conductive member include a metal such as copper, aluminum, gold, silver, tungsten, iron, nickel, and cobalt, or iron-nickel alloy, phosphor bronze, copper-iron alloy, molybdenum; these can be used alone or in the form of an alloy. Moreover, the outermost surface (uppermost surface) of the conductive member is preferably provided with a material capable of reflecting light from the light emitting elements; preferred examples thereof include gold, silver, copper, Pt, Pd, Al, W, Mo, Ru, and Rh. Specifically, the reflectivity in a visible range is preferably 70% or more; in such case, Ag, Ru, Rh, Pt, Pd, etc. are preferably used. In particular, the gloss value is preferably 0.5 or greater, more preferably 1.0 or greater. The gloss value shown in the specification is a value measured using a micro surface color difference meter VSR 300A manufactured by NIPPON DENSHOKU INDUSTRIES CO., LTD., under a condition of an illumination angle of 45° and vertical light receiving.

The outermost surfaces of the bottom surface portion and the first and second exposed portions may be made of respectively different metals such that the outermost surface of the bottom surface portion of the first electrically conductive member is made of Ag or an Ag-containing metal, and the outermost surface of the first exposed portion of the first electrically conductive member and the second exposed portion of the second electrically conductive portion are made of a metal which is less susceptible to sulfuration than Ag, for example, Au, an Au alloy, Pd, or a Pd alloy.

Ag is prone to react under an environment containing, in particular, hydrogen sulfide ($H_2S$), among other sulfur-containing gases. On the other hand, Fe and Cu, which are used as the base material of the electrically conductive members, are prone to react under an environment containing sulfur oxides ($SO_x$), particularly one containing sulfur dioxide ($SO_2$). For this reason, under a mixed-gas environment which contains both hydrogen sulfide and a sulfur oxide, deterioration of Ag at the outermost surface leads to the gas easily entering to the base material (Fe or Cu) beneath the outermost surface, which may result in the alteration extending in a deeper portion (inner portion) of the electrically conductive member. This tends to reduce the thermal conductivity and the like. Particularly, the first and second exposed portions, to which the electrically conductive wires are connected, are loaded with a mechanical power at the time of connecting the electrically conductive wires, so that the surface quality is different than that of the bottom surface portion. More specifically, the exposed portions and the bottom surface portion have different levels of resistance to sulfur-containing gas (corrosive gas); the first and second exposed portions tend to have lower resistance than that of the bottom surface portion.

For this reason, the outermost surface of the bottom surface portion of the first electrically conductive member is made of Ag or an Ag-containing metal having high reflectance to the light from the light emitting element, and the outermost surfaces of the first exposed portion of the first electrically conductive portion and the second exposed portion of the second electrically conductive portion are made of a metal which is less susceptible to sulfuration than is Ag, and also has excellent adhesion with the electrically conductive wire, for example, Au, an Au alloy, Pd, or a Pd alloy, in particular Au among those; thus a light emitting element capable of providing high output power and excellent reliability can be obtained. Moreover, the first and second exposed portions exposed at the second bottom surface are not directly irradiated with light from the light emitting elements, so that even using a metal having lower reflectance than that of Ag at such positions does not absorb much light and thus the light extracting efficiency is not much reduced.

In the case where the outermost surface of the electrically conductive member is made of Ag or an Ag alloy, in order to prevent sulfuration by sulfur containing gas, a covering layer covering the Ag may be formed. For the covering layer, an optically transmissive material is preferably used so as not to reduce the reflectance of Ag; examples of such materials include silicon oxide and aluminum oxide. For the method of disposing those materials, a method such as a sputtering method, a CVD method, or an ALD method can be employed, and the thickness of the layer is preferably 1 nm to 200 nm, and more preferably is 5 nm to 100 nm. In the case where the outermost surface of the bottom surface portion of the electrically conductive member is Ag or an Ag alloy, and the outermost surface of the first and second exposed portion is made of a metal that is other than those, the covering layer may be disposed only at the bottom surface portion or disposed on both the first and second exposed portions of the bottom surface portion. Further, the covering layer may be disposed on the first inner side surface and/or the second inner side surface, and in the case where the light emitting elements and/or the electrically conductive wires are disposed before disposing the covering layer, the covering layer may be disposed on those components.

(Electrically Conductive Wire)

The electrically conductive wires that directly or indirectly connect to the electrodes of the light emitting element and the respective electrically conductive members may be made of a metal such as gold, copper, platinum, aluminum or the like, or an alloy of those metals. It is particularly preferable to use gold that has excellent thermal resistance etc. As shown in FIG. 1A, in the case where the light emitting device 10 has a plurality of light emitting elements 13, joining the electrically conductive wires 14 among the light emitting elements 13 allows the reduction of the joining portions between the electrically conductive members and the electrically conductive wires; in other words, this allows the reduction of the area of the first and second exposed portions. In FIG. 1A, the electrically conductive wires 14 for supplying current to the light emitting elements 13 are arranged to connect the seven light emitting elements, and one of the electrically conductive wires is connected to the first electrically conductive member side and another one of the electrically conductive wires is connected to the second electrically conductive member side. With this arrangement, the area of the first and second exposed portions can be reduced and an unnecessary increase in the size of the resin molded body can be avoided.

(Bonding Member)

The bonding member used in the present embodiment is for fixing a light emitting element on an electrically conductive member. Examples of preferable materials of an electrically conductive bonding member include a conductive paste of silver, gold, palladium, a solder material such as an Au—Sn eutectic solder, a brazing material such as a low melting temperature metal, or the like. An insulating bonding member can be formed using an epoxy resin composite, a silicone resin composite, a polyimide resin composite, a modified resin or a hybrid resin of those, or the like. In the case where those resins are used, in view of deterioration caused by light and/or heat generated from the semiconductor light emitting element, a metal layer with high reflectivity such as Al coating or Ag coating, or a dielectric reflective coating can be disposed on the back surface of the light emitting element.

(Sealing Member)

The sealing member is a member for covering the light emitting element and/or the electrically conductive members to protect them from dust and moisture and further, from external force. The material of the sealing member preferably has optical transmissivity which allows the light from the light emitting element to transmit therethrough, and also has resistance against deterioration by such light. Examples of the material thereof include an insulating resin composition having optical transmissivity which allows the light from the light emitting element to transmit therethrough, such as a silicone resin composition, a modified silicone resin composition, an epoxy resin composition, a modified epoxy resin composition, and an acrylic resin composition. Also, a silicone resin, an epoxy resin, a urea resin, a fluororesin and a hybrid resin containing at least one of these resins may be used.

In addition to these materials, a coloring agent, a light diffusing agent, a light reflecting material, various fillers, a wavelength converting material (a fluorescent material) or the like may also be contained as required. The shape of the outer surface of the sealing member can be selected variously according to the light distribution characteristics or the like. For example, by forming the upper surface in a shape such as a convex lens, a concave lens, or a Fresnel lens, the light distribution characteristics can be adjusted.

(Light Emitting Element)

For the light emitting element, a semiconductor light emitting element of any appropriate wavelength can be employed. For example, for a light emitting element capable of emitting blue or green light, ZnSe, a nitride-based semiconductor (In$_x$Al$_y$Ga$_{1-x-y}$N, $0 \leq X$, $0 \leq Y$, $X+Y \leq 1$), or GaP may be employed. For a light emitting element capable of emitting red light, GaAlAs, AlInGaP, or the like may be employed. A semiconductor light emitting element made of a material other than the above may also be employed. The composition, color of emitted light, size and number of the light emitting elements to be used can be selected appropriately according to the purpose. In the case of forming a light emitting device having a fluorescent material, a nitride semiconductor which is capable of emitting light of a shorter wavelength which is capable of efficiently exciting the fluorescent material is suitably exemplified. The emission wavelength can be variously selected by the materials and the content ratio of the mixed crystal of the semiconductor layer. A light emitting element capable of emitting ultraviolet light or infrared light can also be employed as well as a light emitting element capable of emitting visible light. Further, a light receiving element or the like can be mounted with the light emitting element.

INDUSTRIAL APPLICABILITY

The light emitting devices according to the devices of the present invention can be utilized in applications such as various indicators, lighting apparatus, displays, backlight light sources for liquid crystal displays, and further, digital video cameras, facsimiles, copiers, image reading systems in scanners or the like, and projector devices.

DENOTATION OF REFERENCE NUMERALS 10, 20 . . . light emitting device
11 . . . resin molded body
111 . . . recess
111a . . . first bottom surface
111b . . . second bottom surface
111c . . . first inner surface
111d . . . second inner surface
112a . . . first outer side surface
112a . . . second outer side surface
113 . . . recess in lower surface
12 . . . electrically conductive member
121 . . . first electrically conductive member
121a . . . first terminal portion
121b . . . first bend portion
121c . . . first exposed portion
121d . . . bottom surface portion
121e . . . end portion
122 . . . second electrically conductive member
122a . . . second terminal portion
122b . . . second bend portion
122c . . . second exposed portion
13 . . . light emitting element
14 . . . electrically-conductive wire
15 . . . sealing member
16 . . . protective element

What is claimed is:

1. A light emitting device comprising:
   a resin molded body having a recess;
   a first electrically conductive member and a second electrically conductive member each having terminal portions respectively exposed from a first outer side surface and second outer side surface which are opposite outer side surfaces among the outer side surfaces of the resin molded body; and
   a light emitting element mounted on the first electrically conductive member exposed at a bottom surface of the recess;
   the recess having a first bottom surface on which the light emitting element is mounted and a second bottom surface arranged at a higher location of an outer periphery of the first bottom surface;
   the first electrically conductive member having a first bend portion which is at a position spaced apart from a center line connecting the center of the first outer side surface and the center of the second outer side surface and which extends upward away from the first bottom surface; and
   the first electrically conductive member also having a first exposed portion which is continuous to the first bend portion and is exposed at the second bottom surface.

2. The light emitting device according to claim 1, wherein the first bend portion extends in a direction different from the direction of the center line.

3. The light emitting device according to claim 1, wherein the first bend portion extends in a direction parallel to the direction of the center line.

4. The light emitting device according to claim 1, wherein the first electrically conductive member has an end portion having a shortest distance to the second outer side surface and the first bend portion is arranged at a position closer to the first outer side surface than to the end portion.

5. The light emitting device according to claim 1, wherein the second bend portion has, at a position spaced apart from the center line, a second bend portion bending upward of the recess and a second exposed portion continuous from the second bend portion and exposed at the second bottom surface.

6. The light emitting device according to claim 5, wherein the second bend portion is embedded in the resin molded body.

7. The light emitting device according to claim 5, wherein, in the second electrically conductive member, an outermost surface of the second exposed portion is Au or an Au alloy.

8. The light emitting device according to claim 7, wherein the light emitting element is connected with the second exposed portion by an electrically conductive wire.

9. The light emitting device according to claim 5, wherein the light emitting element is connected with the second exposed portion by an electrically conductive wire.

10. The light emitting device according to claim 5, wherein the resin molded body has a recess in a lower surface where a lower surface of the second exposed portion is exposed.

11. The light emitting device according to claim 1, wherein the first electrically conductive member has an end portion having a shortest distance to the second outer side surface, the first bend portion is arranged at a position closer to the first outer side surface than to the end portion, the second electrically conductive member has, at a position spaced apart from the center line, a second bend portion bending upwardly of the recess and has a second exposed portion continuous from the second bend portion and is exposed at the second bottom surface, and the second bend portion is arranged at a position closer to the first outer side surface than the end portion of the first electrically conductive member.

12. The light emitting device according to claim 1, wherein the first bend portion is embedded in the resin molded body.

13. The light emitting device according to claim 1, wherein, in the first electrically conductive member, the outermost surface of the bottom surface portion is Ag or an Ag alloy and the outermost surface of the first exposed portion is Au or an Au alloy.

14. The light emitting device according to claim 13, wherein the light emitting element is connected with the first exposed portion by an electrically conductive wire.

15. The light emitting device according to claim 13, comprising a covering layer covering the Ag or Ag alloy.

16. The light emitting device according to claim 1, wherein the light emitting element is connected with the first exposed portion by an electrically conductive wire.

17. The light emitting device according to claim 1, wherein the resin molded body has a recess in a lower surface where a lower surface of the first exposed portion is exposed.

* * * * *